(12) United States Patent
Zhou et al.

(10) Patent No.: US 9,799,262 B2
(45) Date of Patent: Oct. 24, 2017

(54) SHIFT REGISTER AND DRIVING METHOD THEREOF, GATE DRIVING CIRCUIT

(71) Applicants: Boe Technology Group Co., Ltd., Beijing (CN); Chengdu Boe Optoelectronics Technology Co., Ltd., Sichuan (CN)

(72) Inventors: Quanguo Zhou, Beijing (CN); Xiaojing Qi, Beijing (CN); Yawen Zhu, Beijing (CN)

(73) Assignees: BOE TECHNOLOGY GROUP CO., LTD., Beijing (CN); CHENGDU BOE OPTOELECTRONICS TECHNOLOGY CO., LTD., Sichuan (CN)

( * ) Notice: Subject to any disclaimer, the term of this patent is extended or adjusted under 35 U.S.C. 154(b) by 68 days.

(21) Appl. No.: 15/021,359

(22) PCT Filed: Jul. 29, 2015

(86) PCT No.: PCT/CN2015/085409
§ 371 (c)(1),
(2) Date: Mar. 11, 2016

(87) PCT Pub. No.: WO2016/138734
PCT Pub. Date: Sep. 9, 2016

(65) Prior Publication Data
US 2016/0379545 A1 Dec. 29, 2016

(30) Foreign Application Priority Data

Mar. 2, 2015 (CN) .......................... 2015 1 0092516

(51) Int. Cl.
*G11C 19/00* (2006.01)
*G09G 3/20* (2006.01)
*G11C 19/28* (2006.01)

(52) U.S. Cl.
CPC ........... *G09G 3/2092* (2013.01); *G11C 19/28* (2013.01); *G11C 19/287* (2013.01); *G09G 2300/0809* (2013.01); *G09G 2310/0286* (2013.01)

(58) Field of Classification Search
CPC combination set(s) only.
See application file for complete search history.

(56) References Cited

U.S. PATENT DOCUMENTS

2007/0274433 A1  11/2007  Tobita
2010/0039363 A1   2/2010  Lee et al.
(Continued)

FOREIGN PATENT DOCUMENTS

CN  1928981    3/2007
CN  101241765  8/2008
(Continued)

OTHER PUBLICATIONS

Office action from Chinese Application No. 201510092516.8 dated Sep. 26, 2016.
(Continued)

*Primary Examiner* — Tuan T Lam
(74) *Attorney, Agent, or Firm* — Calfee, Halter & Griswold LLP (57) ABSTRACT

A shift register and driving method thereof, and a gate driving circuit. The shift register of the present disclosure comprises: an input unit for controlling whether the signal of a first input end is inputted to a charging unit; a charging unit for charging a pull-up node; a pull-up unit for maintaining a high level of the pull-up node; a high level output unit for controlling whether the high level is outputted to the output end according to the level of the pull-up node; a pull-down unit for pulling down the level of the pull-up node and outputting the low level to the output end; a low level output
(Continued)

unit for outputting the low level to the output end. The gate driving circuit of the present disclosure is formed by cascading a plurality of the above shift registers.

20 Claims, 4 Drawing Sheets

(56) References Cited

U.S. PATENT DOCUMENTS

| | | | | |
|---|---|---|---|---|
| 2015/0036784 A1* | 2/2015 | Qing | ............ | G11C 19/184 377/68 |
| 2016/0253975 A1* | 9/2016 | Yang | ............ | G11C 19/28 345/58 |
| 2016/0358572 A1* | 12/2016 | Xiao | ............ | G11C 19/287 |
| 2016/0365054 A1* | 12/2016 | Wu | ............ | G11C 19/28 |
| 2016/0372031 A1* | 12/2016 | Li | ............ | G09G 3/3225 |
| 2016/0372042 A1* | 12/2016 | Ma | ............ | G09G 3/20 |
| 2017/0025057 A1* | 1/2017 | Li | ............ | G09G 3/2092 |
| 2017/0061922 A1* | 3/2017 | Wang | ............ | G09G 5/003 |

FOREIGN PATENT DOCUMENTS

| | | |
|---|---|---|
| CN | 101594135 | 12/2009 |
| CN | 102708799 | 10/2012 |
| CN | 103489422 | 1/2014 |
| CN | 103514851 | 1/2014 |
| CN | 104134430 | 11/2014 |
| CN | 104599624 | 5/2015 |
| JP | 2009288562 | 12/2009 |

OTHER PUBLICATIONS

International Search Report and Written Opinion from PCT/CN15/85409 dated Nov. 24, 2015.

* cited by examiner

SHIFT REGISTER AND DRIVING METHOD THEREOF, GATE DRIVING CIRCUIT

RELATED APPLICATIONS

The present application is the U.S. national phase entry of PCT/CN2015/085409, with an international filing date of Jul. 29, 2015, which claims the benefit of Chinese Patent Application No. 201510092516.8, filed on Mar. 2, 2015, the entire disclosures of which are incorporated herein by reference.

FIELD

The present disclosure relates to the technical field of gate driving, specifically to a shift register and driving method thereof, and a gate driving circuit.

BACKGROUND

In an array substrate of a liquid crystal display device, an organic light-emitting diode (OLED) display device etc, respective gate lines may be controlled by a gate driving circuit (GOA). The gate driving circuit comprises a plurality of cascaded shift registers, wherein an output end of each stage of shift register is connected to one gate line and further connected to a next-stage shift register. Thus it can provide a trigger signal to the next-stage shift register simultaneously with providing a high-level conducting signal to the gate line. In this way, driving of a plurality of gate lines can be effected by means of a few of control signals.

Along with the improvement in the display panel size, resolution and refresh rate, gate lines in an array substrate have become longer and longer, resulting in signal delay from the resistance becoming greater and greater. Meanwhile, conducting time (e.g., the time of high level) of each gate line becomes shorter and shorter. This prevents the respective pixels connected to one gate line from sufficiently charging during its conducting time, thereby resulting in deficiencies in display such as ghosting.

In order to solve the above problem, a technique of making the conducting time of gate lines overlap is proposed. That is, when one gate line keeps conducting, there are other gate lines begin to conduct. Therefore, when the pixels connected to this gate line are charged, the pixels connected to other gate lines would first be "pre-charged". In this way, a better charging effect may be achieved.

Obviously, when the resolution, refresh rate, etc. of the display panel are different, the desired overlapping rate of conducting time of gate lines is also different (e.g., the conducting time of two adjacent gate lines overlaps by ½ or ⅔). However, as for an existing gate driving circuit, in instances where its circuit structure (such as cascade relationship) is unchanged, it is impossible to achieve the purpose of changing the overlapping rate of the conducting time of gate lines by simply adjusting the control signals, thus the application effect thereof is limited.

SUMMARY

The present disclosure provides a shift register that can simply adjust the overlapping rate of the conducting time of gate lines and driving method thereof, and a gate driving circuit so as to at least partly alleviate or eliminate the aforesaid problem.

According to a first aspect of the present disclosure, a shift register is provided, which comprises an input unit, a charging unit, a pull-up unit, a high level output unit, a pull-down unit, and a low level output unit, wherein, the input unit is connected between a first input end and the charging unit, for controlling whether a signal of the first input end is inputted to the charging unit;

the charging unit is connected to a low level input end, a second input end, a control signal input end, and a pull-up node, for charging the pull-up node;

the pull-up unit is connected between the second input end and the pull-up node, for maintaining a high level of the pull-up node;

the high level output unit is connected to a high level input end, an output end, and the pull-up node, for controlling whether a high level is outputted to the output end according to the level of the pull-up node;

the pull-down unit is connected to the low level input end, the high level input end, the control signal input end, the first input end, the second input end, the output end, the pull-up node, and the low level output unit, for pulling down the level of the pull-up node and outputting a low level to the output end;

the low level output unit is connected to the low level input end, the high level input end, the first input end, the second input end, the output end, the pull-up node, and the pull-down unit, for outputting the low level to the output end.

According to an embodiment, the input unit may comprise a first transistor, a gate and a first terminal of which are connected to the first input end, and a second terminal of which is connected to the charging unit.

According to another embodiment, the charging unit may comprise a second transistor, a third transistor and a fourth transistor, wherein, a gate of the second transistor is connected to a second terminal of the third transistor, a first terminal of the second transistor is connected to a second terminal of the first transistor, and a second terminal of the second transistor is connected to the pull-up node;

a gate of the third transistor is connected to the control signal input end, and a first terminal of the third transistor is connected to the second terminal of the first transistor;

a gate of the fourth transistor is connected to the second input end, a first terminal of the fourth transistor is connected to the second terminal of the first transistor, and a second terminal of the fourth transistor is connected to the low level input end.

According to a further embodiment, the pull-up unit may comprise a storage capacitor, a first terminal of which is connected to the second input end and a second terminal of which is connected to the pull-up node.

According to yet another embodiment, the high level output unit may comprise a fifteenth transistor, a gate of which is connected to the pull-up node, a first terminal of which is connected to the high level input end, and a second terminal of which is connected to the output end.

According to an embodiment, the pull-down unit may comprise a fifth transistor, a sixth transistor, a seventh transistor, an eighth transistor, a ninth transistor, a sixteen transistor, and a seventeenth transistor, wherein, a gate and a first terminal of the fifth transistor are connected to the high level input end, and a second terminal of the fifth transistor is connected to a gate of the seventh transistor;

a gate of the sixth transistor is connected to the first input end, a first terminal of the sixth transistor is connected to the gate of the seventh transistor, and a second terminal of the sixth transistor is connected to the low level input end;

a first terminal of the seventh transistor is connected to the second input end, and a second terminal of the seventh transistor is connected to a first terminal of the eighth transistor;

a gate of the eighth transistor is connected to the control signal input end, and a second terminal of the eighth transistor is connected to the first pull-down node;

a gate of the ninth transistor is connected to the first pull-down node, a first terminal of the ninth transistor is connected to the pull-up node, and a second terminal of the ninth transistor is connected to the low level input end;

a gate of the sixteenth transistor is connected to the first pull-down node, a first terminal of the sixteenth transistor is connected to the output end, and a second terminal of the sixteenth transistor is connected to the low level input end;

a gate of the seventeenth transistor is connected to the low level output unit, a first terminal of the seventeenth transistor is connected to the first pull-down node, and a second terminal of the seventeenth transistor is connected to the low level input end.

According to another embodiment, the low level output unit may comprise a tenth transistor, an eleventh transistor, a twelfth transistor, a thirteenth transistor, and a fourteenth transistor, wherein, a gate of the tenth transistor is connected to the second pull-down node, a first terminal of the tenth transistor is connected to the pull-up node, and a second terminal of the tenth transistor is connected to the low level input end;

a gate of the eleventh transistor is connected to the first input end, a first terminal of the eleventh transistor is connected to the second pull-down node, and a second terminal of the eleventh transistor is connected to the low level input end;

a gate of the twelfth transistor is connected to the second input end, a first terminal of the twelfth transistor is connected to the second pull-down node, and a second terminal of the twelfth transistor is connected to the low level input end;

a gate and a first terminal of the thirteenth transistor are connected to the high level input end, and a second terminal of the thirteenth transistor is connected to the second pull-down node;

a gate of the fourteenth transistor is connected to the second pull-down node, a first terminal of the fourteenth transistor is connected to the output end, and a second terminal of the fourteenth transistor is connected to the low level input end;

and wherein, the gate of the seventeenth transistor of the pull-down unit is connected to the second pull-down node of the low level output unit.

According to a further embodiment, the first transistor, the second transistor, the third transistor, the fourth transistor, the fifth transistor, the sixth transistor, the seventh transistor, the eighth transistor, the ninth transistor, the tenth transistor, the eleventh transistor, the twelfth transistor, the thirteenth transistor, the fourteenth transistor, the fifteenth transistor, the sixteenth transistor, and the seventeenth transistor are all N-type transistors.

A second aspect of the present disclosure provides a method of driving a shift register, wherein said shift register is the shift register according to the first aspect of the present disclosure. The method of driving a shift register comprises:

a preparation phase: turning off the high level output unit, the pull-down unit and the low level output unit, thereby enabling the output end to output a low level;

a charging phase: enabling the input unit to charge the pull-up unit, the high level output unit being turned on, thereby enabling the output end to output a high level;

a pull-up phase: continuing charging the pull-up unit, the high level output unit being turned on, thereby enabling the output end to output a high level;

a pull-down phase: turning on the pull-down unit and discharging the pull-up unit, thereby enabling the output end to output a low level;

a pull-down stable phase: turning on a pull-down stable unit, thereby enabling the output end to output a low level.

According to an embodiment, the first transistor, the second transistor, the third transistor, the fourth transistor, the fifth transistor, the sixth transistor, the seventh transistor, the eighth transistor, the ninth transistor, the tenth transistor, the eleventh transistor, the twelfth transistor, the thirteenth transistor, the fourteenth transistor, the fifteenth transistor, the sixteenth transistor, and the seventeenth transistor are all N-type transistors. The method of driving a shift register comprises:

a preparation phase: the control signal input end being inputted a low level, the first input end being inputted a high level, and the second input end being inputted a low level;

a charging phase: the control signal input end being inputted a high level, the first input end being inputted a high level, and the second input end being inputted a low level;

a pull-up phase: the control signal input end being inputted a low level, the second input end being inputted a high level;

a pull-down phase: the control signal input end being inputted a high level, the first input end being inputted a low level, and the second input end being inputted a high level;

a pull-down stable phase: the first input end and the second input end both being inputted a low level.

According to another embodiment, the first input end inputs a high level in said pull-up phase, and a pull-up stable phase is further comprised between the pull-up phase and the pull-down phase, which comprises a first subphase and a second subphase, wherein in the first subphase the first input end and the second input end both are inputted a high level; in the second subphase the control signal input end is inputted a low level, the first input end is inputted a low level, and the second input end is inputted a high level.

A third aspect of the present disclosure provides a gate driving circuit, comprising:

a plurality of cascaded shift registers according to the first aspect of the present disclosure, the output end of each shift register being used for connecting one gate line; wherein the first input end of each stage of shift register is connected to the output end of a previous-stage shift register, and the second input end of each stage of shift register is connected to the output end of a next-stage shift register.

According to an embodiment, as for any two stages of adjacent shift registers, the control signal input end of one of the shift registers is connected to a first clock signal, and the control signal input end of the other shift register is connected to a second clock signal. The first clock signal and the second clock signal are of opposite phases.

In the shift register of the present disclosure, the high level (conducting) time of the output thereof can be adjusted by controlling the signals of the first input end and the second input end. When the shift register is used to constitute a gate driving circuit, since the signals of its two input ends are just outputs of its previous and next-stage shift registers, the high level (conducting) time of each stage of shift register is related to the high level (conducting) time of its previous and next-stage shift registers. Consequently, the overlapping rate of the conducting time of respective gate lines can be changed only by adjusting the signal inputted to the first stage of shift register, such that the function of the gate driving circuit is more flexible and the gate driving circuit can be adapted for needs of various different display devices.

The reference signs are: T1 first transistor; T2 second transistor; T3 third transistor; T4 fourth transistor; T5 fifth transistor; T6 sixth transistor; T7 seventh transistor; T8 eighth transistor; T9 ninth transistor; T10 tenth transistor; T11 eleventh transistor; T12 twelfth transistor; T13 thirteenth transistor; T14 fourteenth transistor; T15 fifteenth transistor; T16 sixteenth transistor; T17 seventeenth transistor; Cst storage capacitor; Vg (n−1) first input end; Vg (n) output end; Vg (n+1) second input end; CK control signal input end; PU pull-up node; PD1 first pull-down node; PD2 second pull-down node; VGL low level input end; VGH high level input end.

DETAILED DESCRIPTION

To enable those skilled in the art to better understand the technical solution of the present disclosure, the present disclosure is further described in detail as follows in combination with the figures and specific implementations.

An embodiment of the present disclosure provides a shift register comprising an input unit, a charging unit, a pull-up unit, a high level output unit, a pull-down unit, and a low level output unit, wherein, the input unit is connected between a first input end and the charging unit, for controlling whether a signal of the first input end is inputted to the charging unit;

the charging unit is connected to a low level input end, a second input end, a control signal input end, and a pull-up node, for charging the pull-up node;

the pull-up unit is connected between the second input end and the pull-up node, for maintaining a high level of the pull-up node;

the high level output unit is connected to a high level input end, an output end, and the pull-up node, for controlling whether a high level is outputted to the output end according to the level of the pull-up node;

the pull-down unit is connected to the low level input end, the high level input end, the control signal input end, the first input end, the second input end, the output end, the pull-up node, and the low level output unit, for pulling down the level of the pull-up node and outputting a low level to the output end;

the low level output unit is connected to the low level input end, the high level input end, the first input end, the second input end, the output end, the pull-up node, and the pull-down unit, for outputting the low level to the output end.

When a plurality of shift registers of the present embodiment are cascaded to constitute a gate driving circuit, the first input end of each stage of shift register is connected to the output end of its previous-stage shift register, while the second input end is connected to the output end of its next-stage shift register. That is to say, each stage of shift register is controlled by its previous and next-stage shift registers and simultaneously controls the previous and next-stage shift registers.

In the shift register of the present embodiment, the high level (conducting) time of the output thereof can be adjusted by controlling the signals of the first input end and the second input end. When the shift register is used to constitute a gate driving circuit, since the signals of its two input ends are just outputs of its previous and next-stage shift registers, the high level (conducting) time of each stage of shift register is related to the high level (conducting) time of its previous and next-stage shift registers. Consequently, the overlapping rate of the conducting time of respective gate lines can be changed only by adjusting the signal inputted to the first stage of shift register, such that the function of the gate driving circuit is more flexible and the gate driving circuit can be adapted for needs of various different display devices.

As shown in FIGS. 1 to 6, the specific structure of the shift register of the present embodiment is introduced in more detail as follows.

Figure 1:
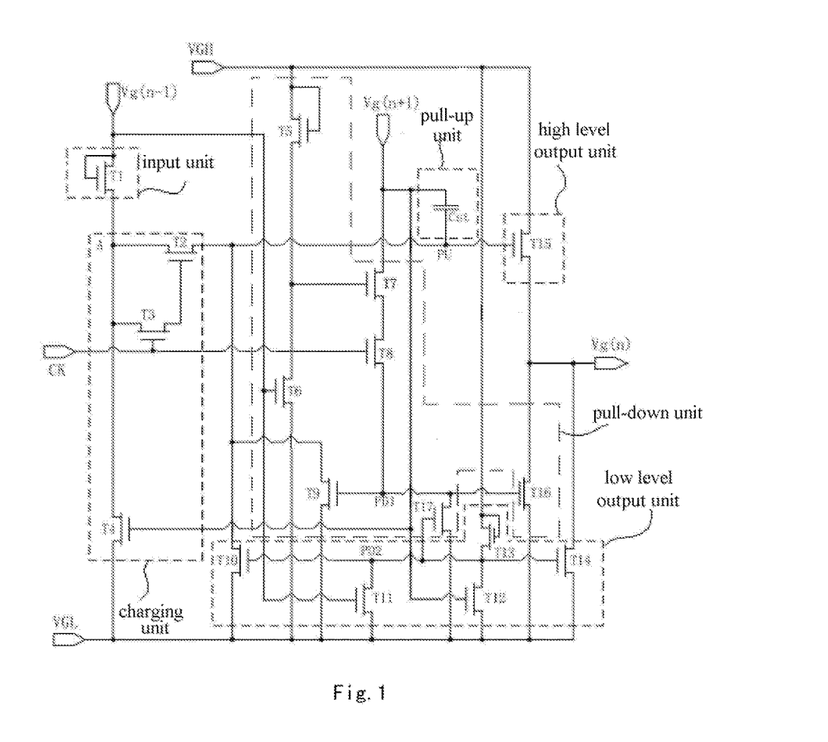
FIG. 1 is a circuit structural schematic diagram of a shift register according to the embodiments of the present disclosure.

As shown in FIG. 1, the input unit comprises a first transistor T1, a gate and a first terminal of which are connected to a first input end Vg (n−1) (which is connected to an output end of a previous-stage shift register), and a second terminal of which is connected to a charging unit.

According to an example, the charging unit comprises a second transistor T2, a third transistor T3 and a fourth transistor T4, wherein, a gate of the second transistor T2 is connected to a second terminal of the third transistor T3, a first terminal of the second transistor T2 is connected to a second terminal of the first transistor T1, and a second terminal of the second transistor T2 is connected to a pull-up node PU;

a gate of the third transistor T3 is connected to a control signal input end CK, and a first terminal of the third transistor T3 is connected to the second terminal of the first transistor T1;

a gate of the fourth transistor T4 is connected to a second input end Vg (n+1) (which is connected to an output end of a next-stage shift register), a first terminal of the fourth transistor T4 is connected to the second terminal of the first transistor T1, and a second terminal of the fourth transistor T4 is connected to a low level input end VGL.

According to an example, the pull-up unit comprises a storage capacitor Cst, a first terminal of which is connected to the second input end Vg (n+1) and a second terminal of which is connected to the pull-up node PU.

According to an example, the high level output unit comprises a fifteenth transistor T15, a gate of which is connected to the pull-up node PU, a first terminal of which is connected to a high level input end VGH, and a second terminal of which is connected to an output end Vg (n).

According to an example, the pull-down unit comprises a fifth transistor T5, a sixth transistor T6, a seventh transistor T7, an eighth transistor T8, a ninth transistor T9, a sixteen transistor T16, and a seventeenth transistor T17, wherein, a gate and a first terminal of the fifth transistor T5 are connected to the high level input end VGH, and a second terminal of the fifth transistor T5 is connected to a gate of the seventh transistor T7;

a gate of the sixth transistor T6 is connected to the first input end Vg (n−1), a first terminal of the sixth transistor T6 is connected to the gate of the seventh transistor T7, and a second terminal of the sixth transistor T6 is connected to the low level input end VGL;

a first terminal of the seventh transistor T7 is connected to the second input end Vg (n+1), and a second terminal of the seventh transistor T7 is connected to a first terminal of the eighth transistor T8;

a gate of the eighth transistor T8 is connected to a control signal input end CK, and a second terminal of the eighth transistor T8 is connected to a first pull-down node PD1;

a gate of the ninth transistor T9 is connected to the first pull-down node PD1, a first terminal of the ninth transistor T9 is connected to the pull-up node PU, and a second terminal of the ninth transistor T9 is connected to the low level input end VGL;

a gate of the sixteenth transistor T16 is connected to the first pull-down node PD1, a first terminal of the sixteenth transistor T16 is connected to the output end Vg (n), and a second terminal of the sixteenth transistor T16 is connected to the low level input end VGL;

a gate of the seventeenth transistor T17 is connected to the low level output unit, a first terminal of the seventeenth transistor T17 is connected to the first pull-down node PD1, and a second terminal of the seventeenth transistor T17 is connected to the low level input end VGL.

According to an example, the low level output unit comprises a tenth transistor T10, an eleventh transistor T11, a twelfth transistor T12, a thirteenth transistor T13, and a fourteenth transistor T14, wherein, a gate of the tenth transistor T10 is connected to a second pull-down node PD2, a first terminal of the tenth transistor T10 is connected to the pull-up node PU, and a second terminal of the tenth transistor T10 is connected to the low level input end VGL;

a gate of the eleventh transistor T11 is connected to the first input end Vg (n−1), a first terminal of the eleventh transistor T11 is connected to the second pull-down node PD2, and a second terminal of the eleventh transistor T11 is connected to the low level input end VGL;

a gate of the twelfth transistor T12 is connected to the second input end Vg (n+1), a first terminal of the twelfth transistor T12 is connected to the second pull-down node PD2, and a second terminal of the twelfth transistor T12 is connected to the low level input end VGL;

a gate and a first terminal of the thirteenth transistor T13 are connected to the high level input end VGH, and a second terminal of the thirteenth transistor T13 is connected to the second pull-down node PD2;

a gate of the fourteenth transistor T14 is connected to the second pull-down node PD2, a first terminal of the fourteenth transistor T14 is connected to the output end Vg (n), and a second terminal of the fourteenth transistor T14 is connected to the low level input end VGL;

and wherein the gate of the seventeenth transistor T17 of the pull-down unit is connected to the second pull-down node PD2 of the low level output unit.

According to an example, the first transistor T1, the second transistor T2, the third transistor T3, the fourth transistor T4, the fifth transistor T5, the sixth transistor T6, the seventh transistor T7, the eighth transistor T8, the ninth transistor T9, the tenth transistor T10, the eleventh transistor T11, the twelfth transistor T12, the thirteenth transistor T13, the fourteenth transistor T14, the fifteenth transistor T15, the sixteenth transistor T16, and the seventeenth transistor T17 may be all N-type transistors.

The embodiments of the present disclosure further provide a method of driving the above shift register, which includes the following steps:

At a preparation phase, turning off the high level output unit, the pull-down unit and the low level output unit, thereby enabling the output end Vg (n) to output a low level;

At a charging phase: enabling the input unit to charge the pull-up unit, the high level output unit being turned on, thereby enabling the output end Vg (n) to output a high level;

At a pull-up phase: continuing charging the pull-up unit, the high level output unit being turned on, thereby enabling the output end Vg (n) to output a high level;

At a pull-down phase: turning on the pull-down unit and discharging the pull-up unit, thereby enabling the output end Vg (n) to output a low level;

At a pull-down stable phase: turning on a pull-down stable unit, thereby enabling the output end Vg (n) to output a low level.

Specifically, as for the above shift register as shown in FIG. 1, the driving method thereof may comprise the following steps, as shown in FIGS. 2 to 5.

Figure 2:
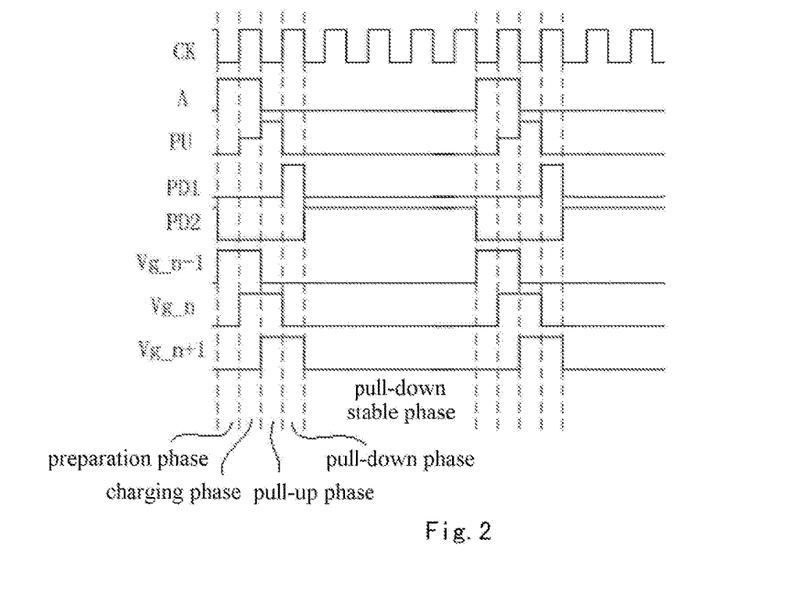
FIG. 2 is a signal driving timing diagram of a shift register according to the embodiments of the present disclosure.

In the preparation phase at S101, the control signal input end CK is at a low level, the first input end Vg (n−1) is at a high level, and the second input end Vg (n+1) is at a low level.

In this phase, the third transistor T3, the eighth transistor T8, the fourth transistor T4 and the twelfth transistor T12 are all turned off, while the sixth transistor T6 and the eleventh transistor T11 are turned on.

It can be seen that the low level of the low level input end VGL can enter the second pull-down node PD2 through the eleventh transistor T11, i.e., entering the second terminal (the lower terminal in the FIG.) of the thirteenth transistor T13, such that the two terminals of the thirteenth transistor T13 are at a high level and low level, respectively, thus the thirteenth transistor T13 is in a high-impedance state (which can be approximately regarded as "open circuit"). Namely, the second pull-down node PD2 can maintain a low level such that the fourteenth transistor T14 is turned off, and at the same time the tenth transistor T10 and the seventeenth transistor T17 are turned off.

Since the eighth transistor T8 is turned off at that time, the first pull-down node PD1 has no input and is at a low level such that the sixteenth transistor T16 is turned off.

Meanwhile, since the third transistor T3 is turned off, the gate of the second transistor T2 has no input such that the second transistor T2 is turned off. Further, since the tenth transistor T10 is also turned off at that time, the pull-up node PU also has no signal input and is at a low level such that the fifteenth transistor T15 is turned off.

It can be seen that the fourteenth transistor T14, the fifteenth transistor T15, and the sixteenth transistor 16 are all turned off at that time, thus the output end Vg (n) outputs a low level (it actually provides no output, but this can also make the transistor driven thereby turned off and this phase is a very short time period, thus it can be regarded as outputting a low level).

In the charging phase at S102, the control signal input end CK is at a high level, the first input end Vg (n−1) is at a high level, and the second input end Vg (n+1) is at a low level.

In this phase, the control signal input end CK becomes to be at a high level, thus the third transistor T3 and the eighth transistor T8 change to be turned on.

At that time, the state of the second pull-down node PD2 is the same as that in the previous phase, thus the fourteenth transistor T14 is still turned off.

Since the sixth transistor T6 is turned on, the two terminals of the fifth transistor T5 are at a high level and low level, respectively, it goes into a high-impedance state, and the second terminal (the lower terminal in the FIG.) of the fifth transistor T5 thereby maintains a low level such that the seventh transistor T7 is turned off. Therefore, although the eighth transistor T8 is turned on, there is still no signal entering the first pull-down node PD1. The first pull-down node PD1 is still at a low level, and the ninth transistor T9 and the sixteenth transistor T16 keep being turned off.

Meanwhile, since the fourth transistor T4 keeps turned off, while the first transistor T1 is turned on, point A in FIG. 1 is at a high level. Further, since the third transistor T3 is turned on, the high level of the point A is transferred to the gate of the second transistor T2 through the third transistor T3 such that the second transistor T2 is turned on, and the high level of the point A is further transferred to the pull-up node PU through the second transistor T2 such that the fifteenth transistor T15 is turned on to transfer the high level of the high level input end VGH to the output end Vg (n), and the shift register outputs a high level. In addition, the first terminal (the upper terminal in the fig) of the storage capacitor Cst at that time is at the low level of the second input end Vg (n+1), thus a voltage difference is generated between the two terminals thereof such that the storage capacitor Cst is charged.

In the pull-up phase at S103, the control signal input end CK is at a low level, and the second input end Vg (n+1) is at a high level.

In this phase, as can be known from the states of the control signal input end CK and the second input end Vg (n+1), the third transistor T3 and the eighth transistor T8 are turned off, while the twelfth transistor T12 and the fourth transistor T4 are turned on.

At that time, since the twelfth transistor T12 is turned on, the thirteenth transistor T13 is in a high-impedance state, and the low level of the low level input end VGL is transferred to the second pull-down node PD2 through the twelfth transistor T12 such that the fourteenth transistor T14 is turned off. Meanwhile, the tenth transistor T10 and the seventeenth transistor T17 are also turned off. Moreover, the eighth transistor T8 is turned off (the seventeenth transistor T17 is also turned off). Thus, the first pull-down node PD1 has no input and is at a low level, such that the ninth transistor T9 and the sixteenth transistor T16 are turned off. Therefore, the low level of the low level input end VGL cannot reach the output end Vg (n).

Meanwhile, since the third transistor T3 is turned off, the second transistor T2 is turned off again, while the ninth transistor T9 and the tenth transistor T10 are also in an off state, thus the pull-up node PU is disconnected from other parts of the circuit such that the storage capacitor Cst cannot discharge. At that time the input of the second input end Vg (n+1) changes from a low level to a high level. Therefore, by virtue of the bootstrap function of the storage capacitor Cst, the level of the pull-up node PU is further elevated, which is still at a high level in terms of function, such that the fifteenth transistor T15 is turned on, the high level of the high level input end VGH enters the output end Vg (n), and the shift register outputs a high level.

It can be seen that in this phase the states of the fourteenth transistor T14, the fifteenth transistor T15, the sixteenth transistor T16 are all unrelated to the first input end Vg (n−1). That is to say, at that time regardless of whether the first input end Vg (n−1) is at a low level as shown in FIG. 2 or at a high level as shown in FIG. 3, the operating state of the shift register is unchanged and it can output a high level.

Figure 3:
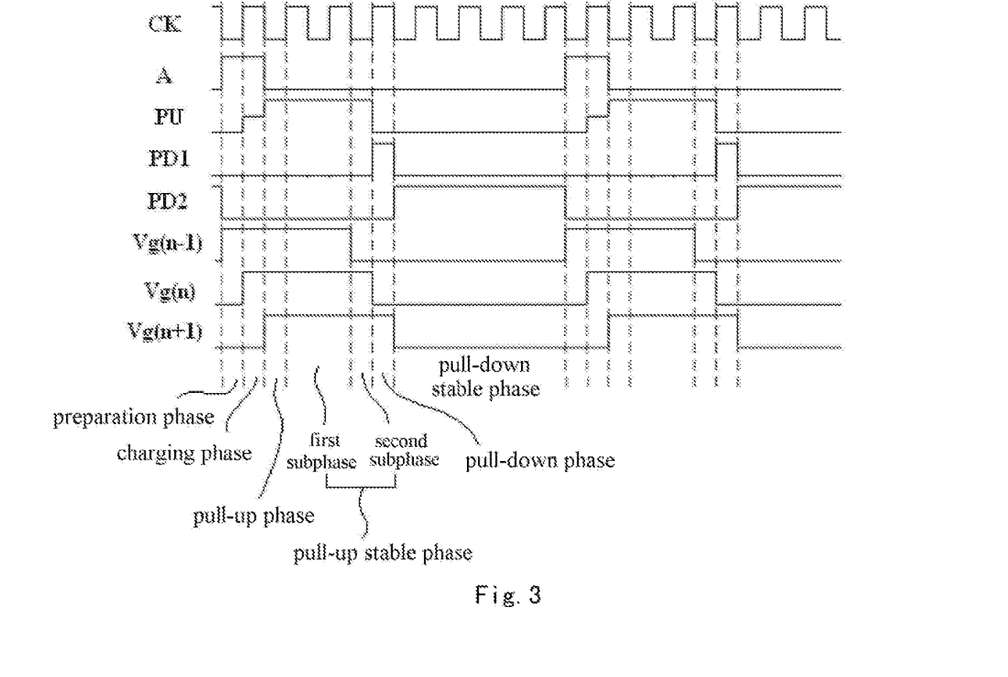
FIG. 3 is another signal driving timing diagram of a shift register according to the embodiments of the present disclosure.

According to an example, at optional S104, as shown in FIG. 3, if the first input end Vg (n−1) in the pull-up phase is at a high level, a pull-up stable phase is further included, comprising a first subphase and a second subphase. In the first subphase, the first input end Vg (n−1) and the second input end Vg (n+1) are both at a high level. In the second subphase, the control signal input end CK is at a low level, the first input end Vg (n−1) is at a low level, and the second input end Vg (n+1) is at a high level.

That is to say, as one situation of the present embodiment, as shown in FIG. 2, if the first input end Vg (n−1) has become to be at a low level in the pull-up phase, skip this step and directly proceed to the following step S105.

Figure 4:
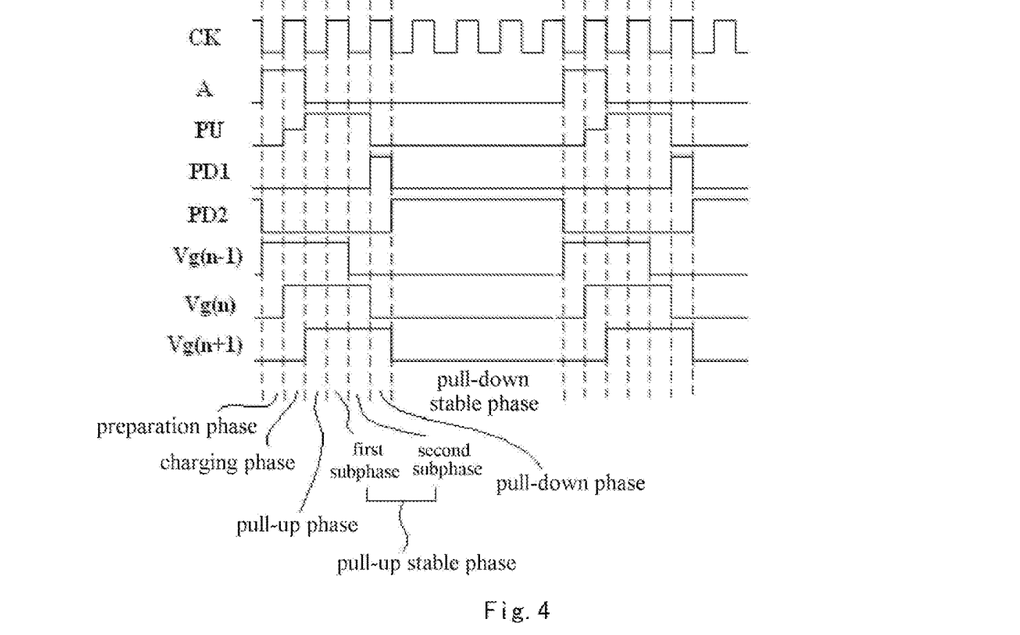
FIG. 4 is a further signal driving timing diagram of a shift register according to the embodiments of the present disclosure.
Figure 5:
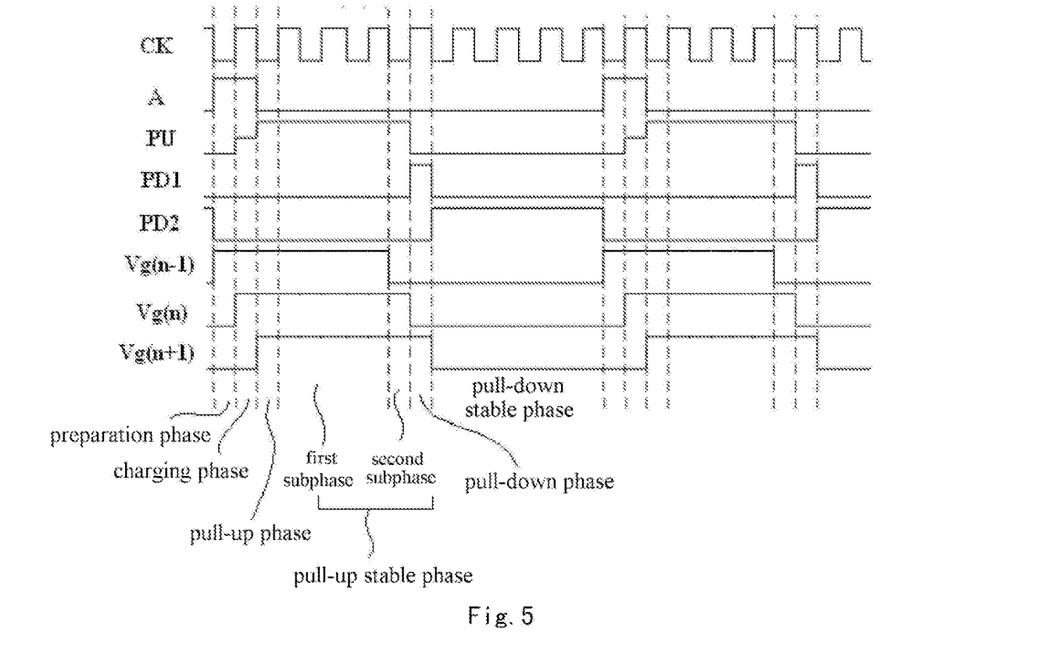
FIG. 5 is yet another signal driving timing diagram of a shift register according to the embodiments of the present disclosure.

Or, as another situation of the present embodiment, as shown in FIGS. 3 to 5, if the first input end Vg (n−1) still maintains a high level in the pull-up phase, proceed to this step.

However, this step is further divided into two subphases. In the first subphase, the first input end Vg (n−1) still maintains a high level, thus the first input end Vg (n−1) and the second input end Vg (n+1) are both at a high level, thereby the fourth transistor T4, the sixth transistor T6, the eleventh transistor T11 and the twelfth transistor T12 are all turned on.

In the first subphase, since the eleventh transistor T11 is turned on, the low level of the low level input end VGL is transferred to the second pull-down node PD2 through the eleventh transistor T11, such that the tenth transistor T10, the fourteenth transistor T14 and the seventeenth transistor T17 are turned off. Moreover, since the sixth transistor T6 is turned on, the fifteenth transistor T15 is in a high-impedance state, thus the gate of the seventh transistor T7 is at a low level such that the seventh transistor T7 is turned off. Since the seventeenth transistor T17 is also turned off, the first pull-down node PD1 has no input and is at a low level, so the sixteenth transistor T16 is turned off. Since the fourteenth transistor T14 and the sixteenth transistor T16 are both turned off, the low level of the low level input end VGL cannot enter the output end Vg (n).

Meanwhile, since the fourth transistor T4 is turned on and the first input end Vg (n−1) is at a high level, the first transistor T1 is in a high-impedance state, thereby point A in FIG. 1 maintains a low level. In this way, when the control signal input end CK is at a high level and causes the third transistor T3 to be turned on, the low level of the point A is transferred to the gate of the second transistor T2 through the third transistor T3 such that the second transistor T2 is turned off. When the control signal input end CK is at a low level and causes the third transistor T3 to be turned off, the gate of the second transistor T2 has no input and is also turned off. In addition, since the tenth transistor T10 is also turned off, the pull-up node PU always has no input, the storage capacitor Cst cannot discharge, and the pull-up node PU maintains a high level all the time by virtue of the function of the storage capacitor Cst such that the fifteenth transistor T15 keeps conducting and the shift register outputs a high level. It can be seen that in this phase regardless of the level of the control signal input end CK, the shift register maintains a stable high level output.

When the first subphase lasts for a period of time, in the case that the first input end Vg (n−1) maintains a high level, the first input end Vg (n−1) becomes to be at a low level, and the control signal input end CK at that time is just at a low level, thereby entering the second subphase.

In the second subphase, the second input end Vg (n+1) is still at a high level, thus the twelfth transistor T12 is turned on and the low level of the low level input end VGL enters the second pull-down node PD2 through the twelfth transistor T12, such that the fourteenth transistor T14, the tenth transistor T10 and the seventeenth transistor T17 are turned off. However, the low level of the control signal input end CK causes the eighth transistor T8 to be turned off, thus the first pull-down node PD1 has no input, and the sixteenth transistor T16 and the ninth transistor T9 are turned off.

Meanwhile, the control signal input end CK is at a low level and further causes the third transistor T3 to be turned off, the second transistor T2 is further turned off, while the ninth transistor T9 and the tenth transistor T10 are also turned off, thus the pull-up node PU has no input and still maintains a high level, the fifteenth transistor T15 keeps conducting, and the shift register outputs a high level.

It can be seen that in this phase the second subphase lasts for 0.5 clock period. Meanwhile, the first subphase lasts for (N+0.5) clock periods (N is a non-negative integer). This is because the control signal input end CK is at a low level before the first subphase starts, and the control signal input end CK is also at a low level after it has ended, thus it cannot last for the whole clock period. Accordingly, this pull-up stable phase lasts in all for an integral number (such as one, two, three, etc.) of clock period(s).

It can be seen that, as shown in FIG. 3, in the first subphase, the signals of the first input end Vg (n−1), the output end Vg (n), and the second input end Vg (n+1) are simultaneously at a high level. As stated above, the signals of the three ports are just signals of three adjacent gate lines, thus the time during which they are at a high level simultaneously is namely the time for overlapped conduction of the gate lines. Accordingly, the overlapping rate of the conducting time of gate lines can be adjusted by adjusting the duration of this phase (or the number of the durative clock periods).

For example, as shown in FIG. 2, the second input end Vg (n+1) becomes to be at a high level at the completion of the high level of the first input end Vg (n−1), and the control signal input end CK is at a high level, then the process directly proceed to step S105 after step S103. The high level time (i.e., conducting time) of two adjacent gate lines overlaps each other by ½.

For another example, as shown in FIG. 3, in the case that the first input end Vg (n−1) maintains a high level, the second input end Vg (n+1) becomes to be at a high level and lasts in the pull-up stable phase which lasts for two clock periods. Then, the high level time (i.e., conducting time) of two Adjacent gate lines overlaps each other by ⅚. Correspondingly, as for the whole gate driving circuit, there would be six gate lines being at a high level (conducting) simultaneously.

In FIG. 3, the pull-up stable phase being two clock signal periods is taken as an example for explanation. However, it is also feasible if this phase only lasts for one clock period, as shown in FIG. 4, or lasts for more clock periods as shown in FIG. 5 (wherein three clock periods is taken as an example). Moreover, they would produce respective overlapping rates of the conducting time of gate lines, respectively. That is to say, as shown in FIGS. 3 to 5, the overlapping rate of the conducting time of gate lines can be adjusted as long as the time of the first subphase (the second subphase must be 0.5 clock period) in the pull-up stable period is controlled.

From this it can be seen that in the case that the circuit structure of the shift register of the present embodiment is not changed, the overlapping rate of the conducting time of gate lines can be changed only by adjusting the signal inputted to the first input end Vg(n−1) of the first-stage shift register and adjusting the frequency of the clock signal (i.e., the signal inputted to the control signal input end CK) (that is adjusting the number of clock periods for which the pull-up stable phase lasts), thereby flexibly adjusting the function of the shift register to adapt for needs of various different display devices.

In the pull-down phase at S105, the control signal input end CK is at a high level, the first input end Vg (n−1) is at a low level, and the second input end Vg (n+1) is at a high level.

As stated above, as shown in FIG. 2, if the first input end Vg (n−1) in the pull-up phase is at a low level, proceed to this step when the input signal of the control signal input end CK becomes to be at a high level.

On the contrary, as shown in FIG. 3, if the first input end Vg (n−1) in the pull-up phase is at a high level, the high level would be maintained for one or more clock periods (i.e., pull-up stable phase). Thereafter, the first input end Vg (n−1) becomes to be at a low level while the control signal input end CK becomes to be at a high level, then proceed to this step.

In this phase, the first transistor T1, the sixth transistor T6 and the eleventh transistor T11 are turned off, while the twelfth transistor T12, the fourth transistor T4, the third transistor T3 and the eighth transistor T8 are turned on.

At that time, since the sixth transistor T6 is turned off, the fifth transistor T5 is no longer in a high-impedance state, and the high level of the high level input end VGH can be transferred to the gate of the seventh transistor T7 through the fifth transistor T5 such that the seventh transistor T7 is turned on. Further, since the eighth transistor T8 is also turned on, the high level of the second input end Vg (n+1) can be transferred to the first pull-down node PD1 through the seventh transistor T7 and the eighth transistor T8 such that the ninth transistor T9 and the sixteenth transistor T16 are turned on. The turning on of the sixteenth transistor T16 enables the low level of the low level input end VGL to be transferred to the output end Vg (n) through the sixteenth transistor T16 such that the output of the shift register becomes a low level over again, i.e., "pulling down" the output of the shift register. In addition, since the twelfth transistor T12 is turned on, the low level of the low level input end VGL is transferred to the second pull-down node PD2 through the twelfth transistor T12 such that the tenth transistor T10, the seventeenth transistor T17 and the fourteenth transistor T14 are turned off.

Meanwhile, since the ninth transistor T9 is turned on, the low level of the low level input end VGL is transferred to the pull-up node PU through the ninth transistor T9 such that the pull-up node PU discharges and becomes a low level. Further, the fifteenth transistor T15 is turned off, such that the high level of the high level input end VGH cannot continue to be outputted.

In the pull-down stable phase at S106, the first input end Vg (n−1) and the second input end Vg (n+1) are both at a low level.

In this phase, the first transistor T1, the sixth transistor T6, the eleventh transistor T11, the fourth transistor T4 and the twelfth transistor T12 are turned off.

At that time, since the twelfth transistor T12 is turned off, the thirteenth transistor T13 is stably turned on to transfer the high level of the high level input end VGH to the second pull-down node PD2, such that the fourteenth transistor T14, the seventeenth transistor T17 and the tenth transistor T10 are turned on, thereby enabling the low level of the low level input end VGL to be transferred to the output end Vg (n) through the fourteenth transistor T14 and the shift register to continue outputting a low level. Meanwhile, the low level of the low level input end VGL is transferred to the first pull-down node PD1 through the seventeenth transistor T17 such that the sixteenth transistor T16 and the ninth transistor T9 are turned off.

Since the tenth transistor T10 is turned on, the low level of the low level input end VGL can be transferred to the pull-up node PU through the tenth transistor T10 such that the fifteenth transistor T15 is stably turned off. Further, since the second input end Vg (n+1) at that time is also at a low level, the levels of the two terminals of the storage capacitor Cst are identical, so it completes discharging and no longer stores electric charges.

In this phase, since the first input end Vg (n−1) is at a low level, the first transistor T1 is turned off. At the same time, the fourth transistor T4 is also turned off under the control of the low level of the second input end Vg (n+1), thus point A necessarily maintains a low level (no input). Therefore, regardless of the level of the control signal input end CK, the second transistor T2 keeps turned off, and the level of the pull-up node PU is not influenced. Meanwhile, the signal of CK would further have impact on T8, but since Vg (n+1) at that time is at a low level, regardless of the state of T8, or in other words, regardless of whether the low level of Vg (n+1) can be transferred to the first pull-down node PD1, the first pull-down node PD1 always maintains a low level state, and the sixteenth transistor T16 is always turned off.

From this it can be seen that after the pull-down phase, when the second input end Vg (n+1) becomes to be at a low level, the shift register enters the pull-down stable phase. In this phase, the first input end Vg (n−1) and the second input end Vg (n+1) both maintain a low level input. Meanwhile, no matter how the level of the control signal input end CK changes, the shift register stably outputs a low level until the next-frame picture. As the previous-stage shift register starts to output a high level, i.e., the signal of the first input end Vg (n−1) of the current-stage shift register becomes a high level over again, the shift register reenters the preparation phase and starts operation of a new period.

Figure 6:
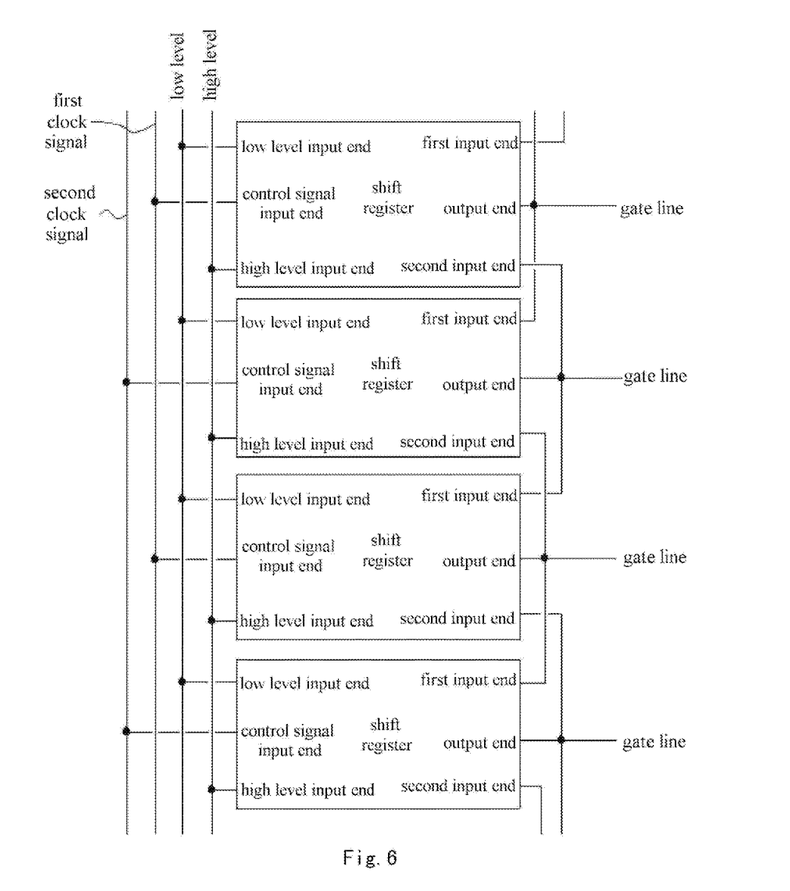
FIG. 6 is a schematic diagram of a cascade relationship of shift registers in a gate driving circuit according to the embodiments of the present disclosure.

As shown in FIG. 6, the present embodiment provides a gate driving circuit, comprising:

a plurality of cascaded shift registers according to the above embodiments, wherein the output end of each shift register is used for connecting one gate line, the first input end of each stage of shift register is connected to the output end of the previous-stage shift register, the second input end of each stage of shift register is connected to the output end of the next-stage shift register.

That is to say, in the gate driving circuit, the first input end of each shift register is connected to the output end of the previous-stage shift register, while the second input end thereof is connected to the output end of the next-stage shift register. Certainly, the output end of each shift register still needs to be connected to one gate line.

It should be understood that as for the first-stage shift register, since it does have a previous stage, the first input end thereof can be connected to a separate input signal; as for the last-stage shift register, it does not have a next stage, thus the second input end thereof can also be connected to a separate input signal (or connected to the output end of the first-stage shift register).

According to an example, as for any two stages of adjacent shift registers, the control signal input end of one of the shift registers is connected to a first clock signal, and the control signal input end of the other shift register is connected to a second clock signal. The first clock signal and the second clock signal are of opposite phases.

As stated above, as can be seen from FIGS. 2, 3, since the operating states of two adjacent shift registers differ by ½ clock period, it is possible to set two clock signals that are just opposite in phase (i.e., differing by ½ clock signal period) and use them to control the respective shift registers in turn. This can namely enable control of the gate driving circuit using minimum control lines.

Specifically, FIG. 6 shows the situation of unilateral driving, i.e., setting a gate driving circuit only at one side of respective gate lines. However, it is also feasible to employ the manner of bilateral driving, i.e., setting the above gate driving circuit respectively at two sides of respective gate lines. Two ends of each gate line are both connected to one shift register (and the two shift registers operate synchronously, in other words "in the same stage"), thereby enabling the driving signal to be inputted simultaneously to the two ends of the gate line. This facilitates decrease in signal delay and enhances the load capacity.

It should be understood that the above embodiments are illustrative embodiments used only for explaining the principle of the present disclosure and not for limiting the present disclosure. Those ordinarily skilled in the art can make various variations and improvements without departing from the spirit and essence of the present disclosure. These variations and improvements are also regarded as the protection scope of the present disclosure. Thus, any inventions disclosed herein are limited only by the claims.

The invention claimed is:

1. A shift register, comprising an input unit, a charging unit, a pull-up unit, a high level output unit, a pull-down unit, and a low level output unit,
  wherein said input unit is connected between a first input end and said charging unit, for controlling that a signal of said first input end is inputted to said charging unit;
  wherein said charging unit is connected to a low level input end, a second input end, a control signal input end, and a pull-up node, for charging said pull-up node;
  wherein said pull-up unit is connected between said second input end and said pull-up node, for maintaining a high level of said pull-up node;
  wherein said high level output unit is connected to a high level input end, an output end, and said pull-up node, for controlling that a high level is outputted to said output end according to the level of said pull-up node;
  wherein said pull-down unit is connected to said low level input end, said high level input end, said control signal input end, said first input end, said second input end, said output end, said pull-up node, and said low level output unit, for pulling down a level of said pull-up node and outputting a low level to said output end; and
  wherein said low level output unit is connected to said low level input end, said high level input end, said first input end, said second input end, said output end, said pull-up node, and said pull-down unit, for outputting the low level to said output end.

2. The shift register according to claim 1, wherein said input unit comprises:
   a first transistor, a gate of said first transistor and a first terminal of said first transistor being connected to said first input end, wherein a second terminal of said first transistor is connected to said charging unit.

3. The shift register according to claim 2, wherein said charging unit comprises a second transistor, a third transistor and a fourth transistor,
   wherein a gate of said second transistor is connected to a second terminal of said third transistor, a first terminal of said second transistor is connected to said second terminal of said first transistor, a second terminal of said second transistor is connected to said pull-up node;
   wherein a gate of said third transistor is connected to said control signal input end, a first terminal of said third transistor is connected to said second terminal of said first transistor; and
   wherein a gate of said fourth transistor is connected to said second input end, a first terminal of said fourth transistor is connected to said second terminal of said first transistor, a second terminal of said fourth transistor is connected to said low level input end.

4. The shift register according to claim 1, wherein said pull-up unit comprises:
   a storage capacitor, a first terminal thereof being connected to said second input end, a second terminal thereof being connected to said pull-up node.

5. The shift register according to claim 4, wherein said high level output unit comprises:
   a fifteenth transistor, a gate thereof being connected to said pull-up node, a first terminal thereof being connected to said high level input end, a second terminal thereof being connected to said output end.

6. The shift register according to claim 5, wherein said pull-down unit comprises a fifth transistor, a sixth transistor, a seventh transistor, an eighth transistor, a ninth transistor, a sixteen transistor, and a seventeenth transistor, wherein:
   a gate and a first terminal of said fifth transistor are connected to said high level input end, and a second terminal of said fifth transistor is connected to a gate of said seventh transistor;
   wherein a gate of said sixth transistor is connected to said first input end, a first terminal of said sixth transistor is connected to said gate of said seventh transistor, and a second terminal of said sixth transistor is connected to said low level input end;
   wherein a first terminal of said seventh transistor is connected to said second input end, and a second terminal of said seventh transistor is connected to a first terminal of said eighth transistor;
   wherein a gate of said eighth transistor is connected to said control signal input end, and a second terminal of said eighth transistor is connected to a first pull-down node;
   wherein a gate of said ninth transistor is connected to said first pull-down node, a first terminal of said ninth transistor is connected to said pull-up node, and a second terminal of said ninth transistor is connected to said low level input end;
   wherein a gate of said sixteenth transistor is connected to said first pull-down node, a first terminal of said sixteenth transistor is connected to said output end, and a second terminal of said sixteenth transistor is connected to said low level input end; and
   wherein a gate of said seventeenth transistor is connected to said low level output unit, a first terminal of said seventeenth transistor is connected to said first pull-down node, and a second terminal of said seventeenth transistor is connected to said low level input end.

7. The shift register according to claim 6, wherein said low level output unit comprises a tenth transistor, an eleventh transistor, a twelfth transistor, a thirteenth transistor, and a fourteenth transistor, wherein
   a gate of said tenth transistor is connected to a second pull-down node, a first terminal of said tenth transistor is connected to said pull-up node, and a second terminal of said tenth transistor is connected to said low level input end;
   wherein a gate of said eleventh transistor is connected to said first input end, a first terminal of said eleventh transistor is connected to said second pull-down node, and a second terminal of said eleventh transistor is connected to said low level input end;
   wherein a gate of said twelfth transistor is connected to said second input end, a first terminal of said twelfth transistor is connected to said second pull-down node, and a second terminal of said twelfth transistor is connected to said low level input end;
   wherein a gate and a first terminal of said thirteenth transistor are connected to said high level input end, and a second terminal of said thirteenth transistor is connected to said second pull-down node;
   wherein a gate of said fourteenth transistor is connected to said second pull-down node, a first terminal of said fourteenth transistor is connected to said output end, and a second terminal of said fourteenth transistor is connected to said low level input end;
   and wherein
   said gate of said seventeenth transistor of said pull-down unit is connected to said second pull-down node of said low level output unit.

8. The shift register according to claim 7, wherein
   said first transistor, said second transistor, said third transistor, said fourth transistor, said fifth transistor, said sixth transistor, said seventh transistor, said eighth transistor, said ninth transistor, said tenth transistor, said eleventh transistor, said twelfth transistor, said thirteenth transistor, said fourteenth transistor, said fifteenth transistor, said sixteenth transistor, and said seventeenth transistor are all N-type transistors.

9. A method of driving said shift register according to claim 1, said method comprising:
   a preparation phase: turning off said high level output unit, said pull-down unit and said low level output unit, thereby enabling said output end to output a low level;
   a charging phase: enabling said input unit to charge said pull-up unit, said high level output unit being turned on, thereby enabling said output end to output a high level;
   a pull-up phase: continuing charging said pull-up unit, said high level output unit being turned on, thereby enabling said output end to output a high level;
   a pull-down phase: turning on said pull-down unit and discharging said pull-up unit, thereby enabling said output end to output a low level;
   a pull-down stable phase: turning on a pull-down stable unit, thereby enabling said output end to output a low level.

10. A method of driving said shift register according to claim 2, said method comprising:
    a preparation phase: turning off said high level output unit, said pull-down unit and said low level output unit, thereby enabling said output end to output a low level;

a charging phase: enabling said input unit to charge said pull-up unit, said high level output unit being turned on, thereby enabling said output end to output a high level;

a pull-up phase: continuing charging said pull-up unit, said high level output unit being turned on, thereby enabling said output end to output a high level;

a pull-down phase: turning on said pull-down unit and discharging said pull-up unit, thereby enabling said output end to output a low level;

a pull-down stable phase: turning on a pull-down stable unit, thereby enabling said output end to output a low level.

11. A method of driving said shift register according to claim 3, said method comprising:
   a preparation phase: turning off said high level output unit, said pull-down unit and said low level output unit, thereby enabling said output end to output a low level;
   a charging phase: enabling said input unit to charge said pull-up unit, said high level output unit being turned on, thereby enabling said output end to output a high level;
   a pull-up phase: continuing charging said pull-up unit, said high level output unit being turned on, thereby enabling said output end to output a high level;
   a pull-down phase: turning on said pull-down unit and discharging said pull-up unit, thereby enabling said output end to output a low level;
   a pull-down stable phase: turning on a pull-down stable unit, thereby enabling said output end to output a low level.

12. A method of driving said shift register according to claim 4, said method comprising:
   a preparation phase: turning off said high level output unit, said pull-down unit and said low level output unit, thereby enabling said output end to output a low level;
   a charging phase: enabling said input unit to charge said pull-up unit, said high level output unit being turned on, thereby enabling said output end to output a high level;
   a pull-up phase: continuing charging said pull-up unit, said high level output unit being turned on, thereby enabling said output end to output a high level;
   a pull-down phase: turning on said pull-down unit and discharging said pull-up unit, thereby enabling said output end to output a low level;
   a pull-down stable phase: turning on a pull-down stable unit, thereby enabling said output end to output a low level.

13. A method of driving said shift register according to claim 5, said method comprising:
   a preparation phase: turning off said high level output unit, said pull-down unit and said low level output unit, thereby enabling said output end to output a low level;
   a charging phase: enabling said input unit to charge said pull-up unit, said high level output unit being turned on, thereby enabling said output end to output a high level;
   a pull-up phase: continuing charging said pull-up unit, said high level output unit being turned on, thereby enabling said output end to output a high level;
   a pull-down phase: turning on said pull-down unit and discharging said pull-up unit, thereby enabling said output end to output a low level;
   a pull-down stable phase: turning on a pull-down stable unit, thereby enabling said output end to output a low level.

14. A method of driving said shift register according to claim 8, said method of driving a shift register comprising:
   a preparation phase: turning off said high level output unit, said pull-down unit and said low level output unit, thereby enabling said output end to output a low level;
   a charging phase: enabling said input unit to charge said pull-up unit, said high level output unit being turned on, thereby enabling said output end to output a high level;
   a pull-up phase: continuing charging said pull-up unit, said high level output unit being turned on, thereby enabling said output end to output a high level;
   a pull-down phase: turning on said pull-down unit and discharging said pull-up unit, thereby enabling said output end to output a low level;
   a pull-down stable phase: turning on a pull-down stable unit, thereby enabling said output end to output a low level.

15. The method of driving a shift register according to claim 14, said method of driving a shift register comprising:
   a preparation phase: said control signal input end being inputted a low level, said first input end being inputted a high level, and said second input end being inputted a low level;
   a charging phase: said control signal input end being inputted a high level, said first input end being inputted a high level, and said second input end being inputted a low level;
   a pull-up phase: said control signal input end being inputted a low level, said second input end being inputted a high level;
   a pull-down phase: said control signal input end being inputted a high level, said first input end being inputted a low level, and said second input end being inputted a high level;
   a pull-down stable phase: said first input end and said second input end both being inputted a low level.

16. The method of driving a shift register according to claim 15, wherein said first input end inputs a high level in said pull-up phase, and a pull-up stable phase is further comprised between said pull-up phase and said pull-down phase, which comprises a first subphase and a second subphase, wherein,
   in said first subphase: said first input end and said second input end both are inputted a high level;
   in said second subphase: said control signal input end is inputted a low level, said first input end is inputted a low level, said second input end is inputted a high level.

17. A gate driving circuit, comprising:
   a plurality of cascaded said shift registers according to claim 1, said output end of each shift register being used for connecting one gate line; wherein said first input end of each stage of shift register is connected to said output end of a previous-stage shift register, said second input end of each stage of shift register is connected to said output end of a next-stage shift register.

18. The gate driving circuit according to claim 17, wherein,
   as for any two stages of adjacent shift registers, said control signal input end of one of said shift registers is connected to a first clock signal, said control signal input end of the other shift register is connected to a second clock signal, said first clock signal and said second clock signal are of opposite phases.

19. A display device comprising said gate driving circuit according to claim 17.

20. A display device comprising said gate driving circuit according to claim 18.

* * * * *